(12) United States Patent
LaFlamme, Jr. et al.

(10) Patent No.: US 8,409,399 B2
(45) Date of Patent: Apr. 2, 2013

(54) REDUCED MAINTENANCE CHEMICAL OXIDE REMOVAL (COR) PROCESSING SYSTEM

(75) Inventors: Arthur H. LaFlamme, Jr., Rowley, MA (US); Thomas Hamelin, Georgetown, MA (US); Jay R Wallace, Danvers, MA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/470,132

(22) Filed: May 21, 2009

(65) Prior Publication Data

US 2009/0226633 A1 Sep. 10, 2009

Related U.S. Application Data

(62) Division of application No. 10/736,991, filed on Dec. 17, 2003, now abandoned.

(51) Int. Cl.
- *C23F 1/00* (2006.01)
- *H01L 21/306* (2006.01)
- *C23C 16/00* (2006.01)

(52) U.S. Cl. ......... 156/345.37; 156/345.31; 156/345.52; 156/914; 118/719; 118/724; 118/725

(58) Field of Classification Search ............... 118/719; 156/345.31, 345.32
See application file for complete search history.

(56) References Cited

U.S. PATENT DOCUMENTS

| | | | |
|---|---|---|---|
| 5,223,113 A | 6/1993 | Kaneko et al. | |
| 5,798,016 A | 8/1998 | Oehrlein et al. | |
| 5,885,353 A | 3/1999 | Strodtbeck et al. | |
| 5,922,219 A * | 7/1999 | Fayfield et al. | 216/58 |
| 6,026,896 A * | 2/2000 | Hunter | 165/206 |
| 6,148,145 A * | 11/2000 | Kadotani | 392/416 |
| 6,228,173 B1 | 5/2001 | Okase et al. | |
| 6,276,072 B1 | 8/2001 | Morad et al. | |
| 6,284,006 B1 * | 9/2001 | Siefering et al. | 29/25.01 |
| 6,632,325 B2 | 10/2003 | Lingampalli | |
| 7,216,496 B2 * | 5/2007 | Yamazaki | 62/185 |
| 2001/0003271 A1 | 6/2001 | Otsuki | |
| 2001/0046768 A1 | 11/2001 | Mezey, Sr. | |
| 2002/0124867 A1 | 9/2002 | Kim et al. | |
| 2002/0152960 A1 * | 10/2002 | Tanaka et al. | 118/723 R |
| 2002/0170672 A1 | 11/2002 | Perlov et al. | |

(Continued)

FOREIGN PATENT DOCUMENTS

| | | |
|---|---|---|
| JP | H07201718 A | 8/1995 |
| JP | 2981243 | 9/1999 |

(Continued)

OTHER PUBLICATIONS

General Magnaplate; "How Coatings Work"; no date; http://www.magnaplate.com/cgi-bin/cms/viewnews.cgi?id=EkpEyFAuZZkQFYJzWt&tmpl=general_information.*

(Continued)

*Primary Examiner* — Karla Moore

(57) ABSTRACT

A chemical oxide removal (COR) processing system is presented, wherein the COR processing system includes a first treatment chamber and a second treatment chamber. The first treatment chamber comprises a chemical treatment chamber that provides a temperature controlled chamber having a protective barrier. The second treatment chamber comprises a heat treatment chamber that provides a temperature-controlled chamber having a protective barrier.

21 Claims, 10 Drawing Sheets

U.S. PATENT DOCUMENTS

| | | | |
|---|---|---|---|
| 2003/0037880 A1 | 2/2003 | Carducci et al. | |
| 2003/0071035 A1* | 4/2003 | Brailove | 219/672 |
| 2003/0159780 A1 | 8/2003 | Carpenter et al. | |
| 2004/0083970 A1 | 5/2004 | Imafuku et al. | |
| 2004/0134427 A1* | 7/2004 | Derderian et al. | 118/715 |

FOREIGN PATENT DOCUMENTS

| | | | |
|---|---|---|---|
| JP | 2000100781 A | | 4/2000 |
| JP | 2001226773 A | | 8/2001 |
| JP | 2002289596 A | | 10/2002 |
| JP | 2003133284 A | | 5/2003 |
| JP | 2004526053 A | | 8/2004 |
| JP | 2005521250 A | | 7/2005 |
| KR | 10-2000-0028954 | | 5/2000 |
| KR | 10-2003-0068569 | | 8/2003 |
| KR | 10-2003-0068569 A | | 8/2003 |
| WO | WO 9619825 A1 * | | 6/1996 |
| WO | WO 9966545 A1 * | | 12/1999 |
| WO | WO 0070116 A1 * | | 11/2000 |
| WO | 02054453 A1 | | 7/2002 |
| WO | WO 03/021642 A2 | | 3/2003 |
| WO | WO 03/060187 A1 | | 7/2003 |
| WO | 03080892 A1 | | 10/2003 |
| WO | WO 2004/084280 A3 | | 9/2004 |

OTHER PUBLICATIONS

General Magnaplate; "TUFRAM—Surface Enhancement Coatings Protect Aluminum and Aluminum Alloys Against Wear, Corrosion, Sticking and Galling"; no date; http://www.magnaplate.com/literature/brochures/pdf/tufram.pdf.*

General Magnaplate; "NEDOX—Surface Enhancement Coatings Protect Most Metals—Including Aluminum—Against Wear, Corrosion, Sticking and Galling"; no date; http://www.magnaplate.com/literature/brochures/pdf/nedox.pdf.*

Japanese Office Action issued in Application No. 2006-545638 mailed Aug. 3, 2010.

Machine English language translation of JP 2005-521250, published Jul. 2005.

Machine English language translation of JP 2000-100781, published Apr. 2000.

Machine English language translation of JP 2001-226773, published Aug. 2001.

Machine English language translation of JP H07-201718, published Aug. 1995.

Machine English language translation of JP 2002-289596, published Oct. 2002.

Partial English language translation of JP 2000-100781, published Apr. 2005; JP 2001-226773, published Aug. 2001; and JP H07-201718, published Aug. 1995.

Korean Office Action issued in Application No. 10-2006-7010679 mailed May 30, 2011.

Korean Office Action issued in Application No. 10-2006-7010679 mailed Feb. 17, 2012.

Machine English language translation of Abstract for JP 02-256235, published Oct. 1990 (Published Application corresponding to JP Patent No. 2981243).

Machine English language translation of JP 2003-133284, published May 2003.

Machine English language translation of JP 2004-526053, published Aug. 2004 (JP counterpart application to KR Application Publication No. 10-2003-0068569).

* cited by examiner

REDUCED MAINTENANCE CHEMICAL OXIDE REMOVAL (COR) PROCESSING SYSTEM

CROSS-REFERENCE TO RELATED APPLICATIONS

This application is related to pending U.S. Patent Application Ser. No. 60/454,597, entitled "Processing System and Method For Treating a Substrate", filed on Mar. 17, 2003; pending U.S. Patent Application Ser. No. 60/454,642, entitled "Processing System and Method For Chemically Treating a Substrate", filed on Mar. 17, 2003; pending U.S. Patent Application Ser. No. 60/454,641, entitled "Processing System and Method For Thermally Treating a Substrate", filed on Mar. 17, 2003; and pending U.S. Patent Application Ser. No. 60/454,644, entitled "Method and Apparatus For Thermally Insulating Adjacent Temperature Controlled Chambers", filed on Mar. 17, 2003. The entire contents of all of those applications are herein incorporated by reference in their entirety.

FIELD OF THE INVENTION

The present invention relates to a system and method for processing a substrate, and more particularly to a system and method for protecting chemical and thermal treatment chambers.

BACKGROUND OF THE INVENTION

During semiconductor processing, a dry plasma etch process can be utilized to remove or etch material along fine lines, within vias, or contacts patterned on a silicon substrate. The plasma etch process generally involves positioning a semiconductor substrate with an overlying patterned, protective layer, for example a photoresist layer, in a processing chamber. Once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, gates, etc.) in the selected regions of the substrate. Such substrate materials where etching is required include silicon dioxide ($SiO_2$), low-k dielectric materials, poly-silicon, and silicon nitride.

During material processing, etching such features generally comprises the transfer of a pattern formed within a mask layer to the underlying film within which the respective features are formed. The mask can, for example, comprise a light-sensitive material such as (negative or positive) photoresist, multiple layers including such layers as photo-resist and an anti-reflective coating (ARC), or a hard mask formed from the transfer of a pattern in a first layer, such as photo-resist, to the underlying hard mask layer.

SUMMARY OF THE INVENTION

The present invention relates to a system and method for protecting a chemical treatment chamber and/or heat treatment chamber.

In one aspect of the invention, a processing system is described for performing material removal on a substrate comprising a first treatment system and a second treatment system, wherein the first and second treatment systems are coupled to one another. The first treatment system comprises a chemical treatment system, and a protective barrier formed on at least one component of the chemical treatment system. The second treatment system comprises a thermal treatment system and a protective barrier formed on at least one component of the thermal treatment system.

DETAILED DESCRIPTION OF SEVERAL EMBODIMENTS

In material processing methodologies, pattern etching comprises the application of a thin layer of light-sensitive material, such as photoresist, to an upper surface of a substrate, that is subsequently patterned in order to provide a mask for transferring this pattern to the underlying thin film during etching. The patterning of the light-sensitive material generally involves exposure of the light-sensitive material by a radiation source through a reticle (and associated optics) using, for example, a micro-lithography system, followed by the removal of the irradiated regions of the light-sensitive material (as in the case of positive photoresist), or non-irradiated regions (as in the case of negative resist) using a developing solvent.

Additionally, multi-layer and hard masks can be implemented for etching features. For example, when etching features using a hard mask, the mask pattern in the light-sensitive layer is transferred to the hard mask layer using a separate etch step preceding the main etch step. The hard mask can, for example, be selected from several materials for silicon processing including silicon dioxide ($SiO_2$), silicon nitride ($Si_3N_4$), and carbon, for example.

In order to reduce the feature size formed, the hard mask can be trimmed laterally using, for example, a two-step process involving a chemical treatment of the exposed surfaces of the hard mask layer in order to alter the surface chemistry of the hard mask layer, and a thermal treatment of the exposed surfaces of the hard mask layer in order to desorb the altered surface chemistry.

Figure 1:
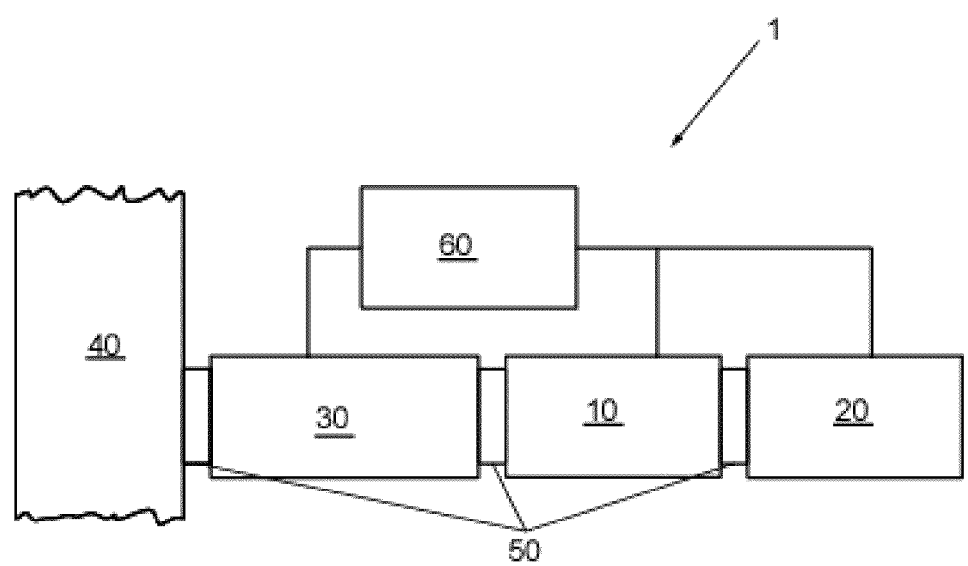
FIG. 1 illustrates a schematic representation of a processing system according to an embodiment of the present invention.

FIG. 1 illustrates a schematic representation of a processing system according to an embodiment of the present invention. In the illustrated embodiment shown in FIG. 1, a processing system 1 for processing a substrate using, for example, mask layer trimming is shown. Processing system 1 can comprise a first treatment system 10, and a second treatment system 20 coupled to the first treatment system 10. For example, the first treatment system 10 can comprise a thermal treatment system, and the second treatment system 20 can comprise a chemical treatment system. Also, as illustrated in FIG. 1, a transfer system 30 can be coupled to the first treatment system 10 in order to transfer substrates into and out of the first treatment system 10 and the second treatment system 20, and exchange substrates with a multi-element manufacturing system 40.

The first and second treatment systems 10, 20, and the transfer system 30 can, for example, comprise a processing element coupled to the multi-element manufacturing system 40. The multi-element manufacturing system 40 can permit the transfer of substrates to and from processing elements including such devices as etch systems, deposition systems, coating systems, patterning systems, metrology systems, etc. In order to isolate the processes occurring in the first and second systems, an isolation assembly 50 can be utilized to couple each system. For instance, the isolation assembly 50 can comprise at least one of a thermal insulation assembly to provide thermal isolation, and a gate valve assembly to provide vacuum isolation. In alternate embodiments, treatment systems 10 and 20, and transfer system 30 can be placed in any sequence.

In addition, a controller 60 can be coupled to the first treatment system 10, the second treatment system 20, and the transfer system 30. For example, controller 60 can be used to control the first treatment system 10, the second treatment system 20, and the transfer system 30. Also, controller 60 can be coupled to a control element (not shown) in the multi-element manufacturing system 40.

Alternately, the first treatment system 10, the second treatment system 20, and the transfer system 30 can be configured differently. For example, a stacked arrangement or a side-by-side arrangement can be used.

In general, at least one of the first treatment system 10 and the second treatment system 20 of the processing system 1 depicted in FIG. 1 comprises at least two transfer openings to permit the passage of the substrate therethrough. For example, as depicted in FIG. 1, the first treatment system 10 comprises two transfer openings, the first transfer opening permits the passage of the substrate between the first treatment system 10 and the transfer system 30 and the second transfer opening permits the passage of the substrate between the first treatment system 10 and the second treatment system 20. Alternately, each treatment system can comprise at least one transfer opening to permit the passage of the substrate therethrough.

Figure 2:
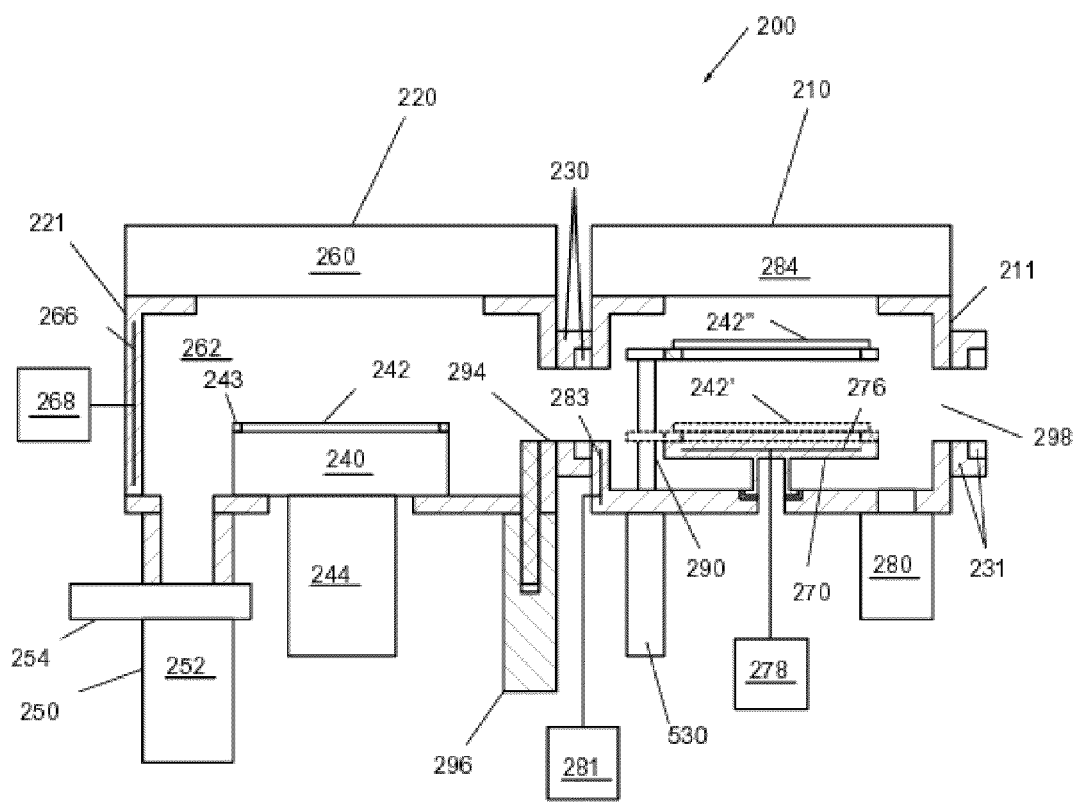
FIG. 2 shows a schematic cross-sectional view of a processing system according to an embodiment of the present invention.

FIG. 2 shows a schematic cross-sectional view of a processing system according to an embodiment of the present invention. In the illustrated embodiment, a processing system 200 for performing chemical treatment and thermal treatment of a substrate is shown. Processing system 200 can comprise a thermal treatment system 210, and a chemical treatment system 220 coupled to the thermal treatment system 210. The thermal treatment system 210 can comprise a thermal treatment chamber 211, which can be temperature-controlled. The chemical treatment system 220 can comprise a chemical treatment chamber 221, which can be temperature-controlled. The thermal treatment chamber 211 and the chemical treatment chamber 221 can be thermally insulated from one another using a thermal insulation assembly 230, and vacuum isolated from one another using a gate valve assembly 296, to be described in greater detail below.

Figure 3:
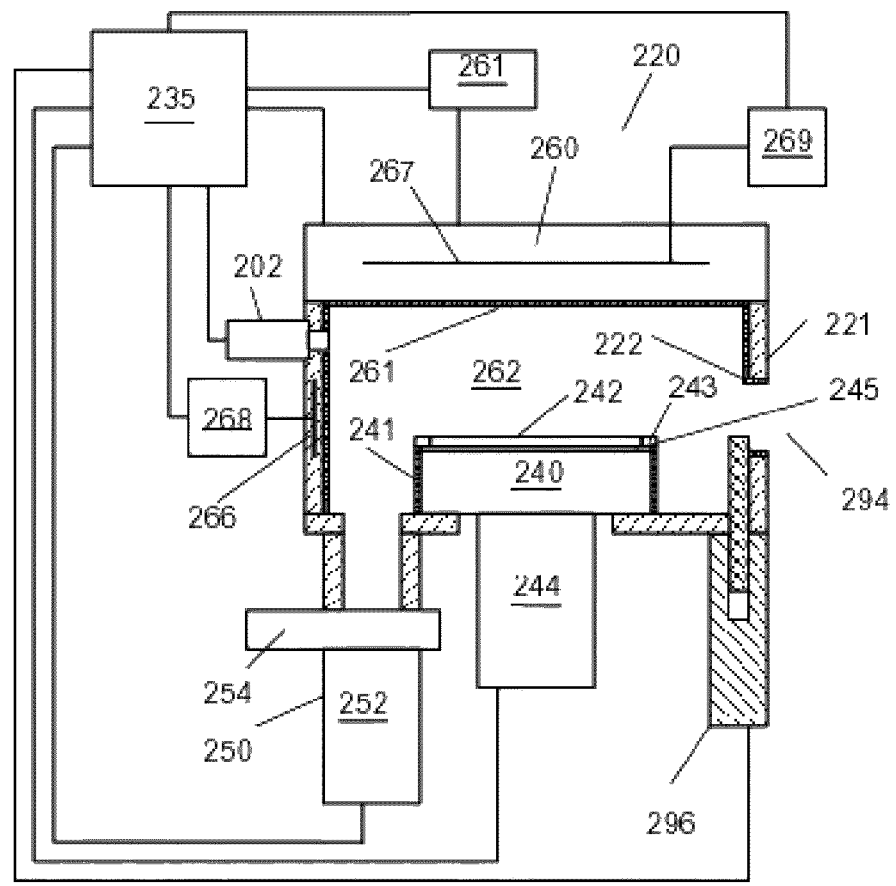
FIG. 3 shows a schematic cross-sectional view of a chemical treatment system according to an embodiment of the present invention.

FIG. 3 shows a schematic cross-sectional view of a chemical treatment system according to an embodiment of the present invention. As illustrated in FIGS. 2 and 3, the chemical treatment system 220 can further comprise a temperature controlled substrate holder 240 configured to be substantially thermally isolated from the chemical treatment chamber 221 and configured to support a substrate 242 and a centering ring 243. The centering ring 243 can be made of polytetrafluoroethylene (PTFE) and/or tetrafluoroethylene (TFE). Also, substrate holder 240 can comprise a protective barrier 241 formed on one or more exposed surfaces of the substrate holder 240. In one embodiment, the protective barrier 241 can be created by anodizing a metal, and impregnating the anodized surface with PTFE and/or TFE. For example, a protective barrier can be formed by hard anodizing aluminum or hard anodizing an aluminum alloy and impregnating the hard-anodized surface with TFE and/or PTFE. In an alternate embodiment, protective barrier 241 is not required.

In an alternate embodiment of the present invention, the protective barrier 241 can comprise at least one of $Al_2O_3$, Yttria ($Y_2O_3$), $Sc_2O_3$, $Sc_2F_3$, $YF_3$, $La_2O_3$, $CeO_2$, $Eu_2O_3$, and $DyO_3$. In additional embodiments of the present invention, the protective barrier 222 can comprise at least one of a column-III element (column III of periodic table) and a Lanthanon element. In another embodiment of the present invention, the column-III element can comprise at least one of Yttrium, Scandium, and Lanthanum. In another embodiment of the present invention, the Lanthanon element can comprise at least one of Cerium, Dysprosium, and Europium.

In an embodiment of the present invention, the protective barrier 241 can have a minimum thickness, wherein the minimum thickness can be specified as constant across at least one of the interior surfaces. In another embodiment, the minimum thickness can be variable across the interior surfaces. Alternately, the minimum thickness can be constant over a first portion of a surface and variable over a second portion of the surface. For example, a variable thickness can occur on a curved surface, on a corner, or in a hole. For example, the minimum thickness can range from about 0.5 microns to about 500 microns. Alternatively; the minimum thickness can range from about 100 microns to about 200 microns; or the minimum thickness can be at least about 120 microns.

Furthermore, substrate holder 240 can comprise a protective barrier 245 formed on the top surface of the substrate holder 240. Protective barrier 245 can be made of a material selected from the same range of materials and can have the same thickness as was described for protective barrier 241. Alternatively protective barrier 245 is not required.

Also, the chemical treatment system 220 can further comprise a vacuum pumping system 250 coupled to the chemical treatment chamber 221 to control the pressure in the chemical treatment chamber 221, and an upper assembly 260 that can comprise a gas distribution system for introducing a process gas into a process space 262 within the chemical treatment chamber 221.

In addition, chemical treatment chamber 221 can comprise a protective barrier 222 formed on one or more interior surfaces of the chemical treatment chamber 221. Protective barrier 222 can be made of a material selected from the same range of materials and can have the same thickness as was described for protective barrier 241. Alternatively protective barrier 222 is not required.

Furthermore, a protective barrier 261 can be formed on one or more interior surfaces of the upper assembly 260. Protective barrier 261 can be made of a material selected from the same range of materials and can have the same thickness as was described for protective barrier 241. Alternatively protective barrier 261 is not required.

The present invention may include a multi-step process that can include, for example, preparing one or more surfaces to receive the protective barrier, and then forming the protective barrier on those surfaces.

Figure 5:
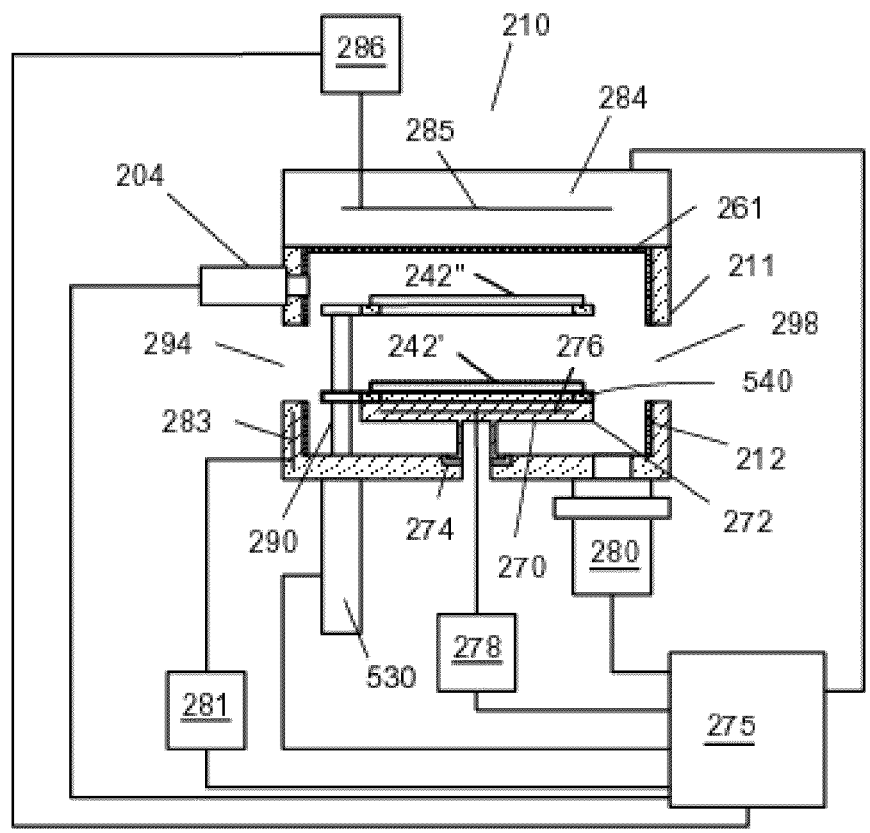
FIG. 5 shows a schematic cross-sectional view of a thermal treatment system according to an embodiment of the present invention.

As illustrated in FIGS. 2 and 5, the thermal treatment system 210 can further comprise a temperature controlled substrate holder 270 mounted within the thermal treatment chamber 211 and configured to be substantially thermally insulated from the thermal treatment chamber 211 and configured to support a substrate 242', a vacuum pumping system 280 to evacuate the thermal treatment chamber 211, a substrate lifter assembly 290, and a drive system 530 coupled to the thermal treatment chamber 211. Lifter assembly 290 can vertically translate the substrate 242" between a holding plane (solid lines) and the substrate holder 270 (dashed lines), or a transfer plane located therebetween. The thermal treatment chamber 211 can further comprise an upper assembly 284.

In addition, thermal treatment chamber 211 can comprise a protective barrier 212 formed on one or more interior surfaces of the thermal treatment chamber 211. Protective barrier 212 can be made of a material selected from the same range of materials and can have the same thickness as was described for protective barrier 241. Alternatively protective barrier 212 is not required.

Additionally, the thermal treatment chamber 211, chemical treatment chamber 221, and thermal insulation assembly 230 define a common opening 294 through which a substrate can be transferred. During processing, the common opening 294 can be sealed closed using a gate valve assembly 296 in order to permit independent processing in the two chambers 211, 221.

Furthermore, a transfer opening 298 can be formed in the thermal treatment chamber 211 in order to permit substrate exchanges with a transfer system as illustrated in FIG. 1. A second thermal insulation assembly 231 can be implemented to thermally insulate the thermal treatment chamber 221 from a transfer system (not shown). Although the opening 298 is illustrated as part of the thermal treatment chamber 211 (consistent with FIG. 1), the transfer opening 298 can be formed in the chemical treatment chamber 221 and not the thermal treatment chamber 211 (reverse chamber positions as shown in FIG. 1).

Also, exposed surfaces of the gate valve assembly 296, the common opening 294, and/or the transfer opening 298 can be provided with a protective barrier (not shown). The protective barrier can be made of a material selected from the same range of materials and can have the same thickness as was described for protective barrier 241. Alternatively the protective barrier is not required.

As illustrated in FIGS. 2 and 3, the chemical treatment system 220 can comprise a substrate holder 240, and a substrate holder assembly 244 in order to provide several operational functions for thermally controlling and processing substrate 242. The substrate holder 240 and substrate holder assembly 244 can comprise an electrostatic clamping system (or mechanical clamping system) in order to electrically (or mechanically) clamp substrate 242 to the substrate holder 240. For example, the clamping system can comprise a top surface comprising PTFE and/or TFE.

Furthermore, substrate holder 240 can, for example, further include a cooling system having a re-circulating coolant flow that receives heat from substrate holder 240 and transfers heat to a heat exchanger system (not shown), or when heating, transfers heat from the heat exchanger system. Moreover, a heat transfer gas can, for example, be delivered to the back-side of substrate 242 via a backside gas system to improve the gas-gap thermal conductance between substrate 242 and substrate holder 240. For instance, the heat transfer gas supplied to the back-side of substrate 242 can comprise an inert gas such as helium, argon, xenon, krypton, a process gas such as $CF_4$, $C_4F_8$, $C_5F_8$, $C_4F_6$, etc., or other gas such as oxygen, nitrogen, or hydrogen. Such a system can be utilized when temperature control of the substrate is required at elevated or reduced temperatures. For example, the backside gas system can comprise a multi-zone gas distribution system such as a two-zone (center-edge) system, wherein the backside gas gap pressure can be independently varied between the center and the edge of substrate 242. In other embodiments, heating/cooling elements, such as resistive heating elements, or thermo-electric heaters/coolers can be included in the substrate holder 240, as well as the chamber wall of the chemical treatment chamber 221.

Figure 7:
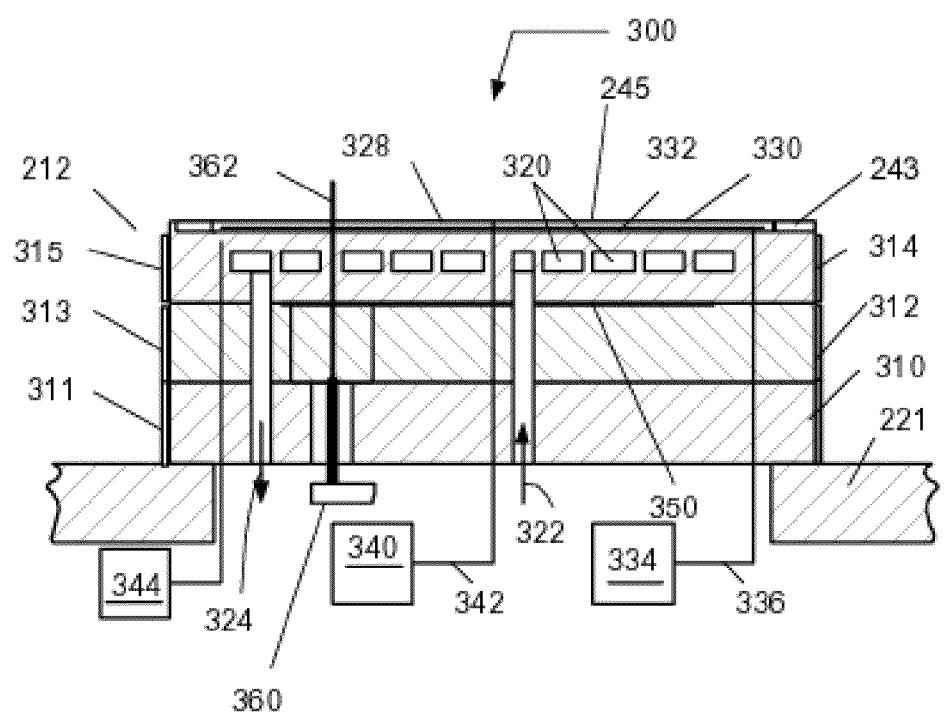
FIG. 7 illustrates a schematic cross-sectional view of a substrate holder according to an embodiment of the present invention.

FIG. 7 illustrates an embodiment of a temperature controlled substrate holder 300 which performs several of the above-identified functions. Substrate holder 300 can comprise a chamber mating component 310 coupled to a lower wall of the chemical treatment chamber 221, an insulating component 312 coupled to the chamber mating component 310, and a temperature control component 314 coupled to the insulating component 312. The chamber mating and temperature control components 310, 314 can be fabricated from an electrically and thermally conducting material such as aluminum, stainless steel, nickel, etc. The insulating component 312 can be fabricated from a thermally-resistant material having a relatively lower thermal conductivity such as quartz, alumina, TFE, PTFE, etc.

In addition, chamber mating and temperature control components 310, 314 can comprise protective barriers 311, 315 formed on one or more exterior surfaces thereof. Also, insulating component 312 can comprise a protective barrier 313 formed on one or more exterior surfaces thereof. Protective barriers 311, 313 and 315 can each be made of a material selected from the same range of materials and can have the same thickness as was described for protective barrier 241. Alternatively one or more of protective barriers 311, 313 and 315 is not required.

The temperature control component 314 can comprise temperature control elements such as cooling channels, heating channels, resistive heating elements, or thermo-electric elements. For example, as illustrated in FIG. 7, the temperature control component 314 can comprise a coolant channel 320 having a coolant inlet 322 and a coolant outlet 324. The coolant channel 320 can, for example, be a spiral passage within the temperature control component 314 that permits a flow of coolant, such as water, Fluorinert, Galden HT-135, etc., in order to provide conductive-convective cooling of the temperature control component 314. Alternately, the temperature control component 314 can comprise an array of thermo-electric elements capable of heating or cooling a substrate depending upon the direction of electrical current flow through the respective elements. An exemplary thermo-electric element is one commercially available from Advanced Thermoelectric, Model ST-127-1.4-8.5M (a 40 mm by 40 mm by 3.4 mm thermo-electric device capable of a maximum heat transfer power of 72 W).

Additionally, the substrate holder 300 can further comprise an electrostatic clamp (ESC) 328 comprising a ceramic layer 330, a clamping electrode 332 embedded therein, and a high-voltage (HV) DC voltage supply 334 coupled to the clamping electrode 332 using an electrical connection 336. The ESC 328 can, for example, be mono-polar, or bi-polar. The design and implementation of such a clamp is well known to those skilled in the art of electrostatic clamping systems. In one embodiment, a protective barrier 243 can be formed on the upper surface of the substrate holder. Protective barrier 243 can be made of a material selected from the same range of materials and can have the same thickness as was described for protective barrier 241. Alternatively protective barrier 243 is not required.

Additionally, the substrate holder 300 can further comprise a back-side gas supply system 340 for supplying a heat transfer gas, such as an inert gas including helium, argon, xenon, krypton, a process gas including $CF_4$, $C_4F_8$, $C_5F_8$, $C_4F_6$, etc., or other gas including oxygen, nitrogen, or hydrogen, to the backside of substrate 242 through at least one gas supply line 342. The backside gas supply system 340 can be a multi-zone supply system such as a two-zone (center-edge) system, wherein the backside pressure can be varied radially from the center to edge.

The insulating component 312 can further comprise a thermal insulation gap 350 in order to provide additional thermal insulation between the temperature control component 314 and the underlying mating component 310. The thermal insulation gap 350 can be evacuated using a pumping system (not shown) or a vacuum line as part of vacuum pumping system 250, and/or coupled to a gas supply (not shown) in order to vary its thermal conductivity. The gas supply can, for example, be the backside gas supply 340 utilized to couple heat transfer gas to the backside of the substrate 242.

The mating component 310 can further comprise a lift pin assembly 360 capable of raising and lowering three or more lift pins 362 in order to vertically translate substrate 242 to and from an upper surface of the substrate holder 300 and a transfer plane in the processing system.

Each component 310, 312, and 314 can further comprise fastening devices (such as bolts and tapped holes) in order to affix one component to another, and to affix the substrate holder 300 to the chemical treatment chamber 221. Furthermore, each component 310, 312, and 314 facilitates the passage of the above-described utilities to the respective component, and vacuum seals, such as elastomer O-rings, are utilized where necessary to preserve the vacuum integrity of the processing system.

The temperature of the temperature-controlled substrate holder 240 can be monitored using a temperature-sensing device 344 such as a thermocouple (e.g. a K-type thermocouple, Pt sensor, etc.). Furthermore, a controller can utilize the temperature measurement as feedback to the substrate holder assembly 244 in order to control the temperature of substrate holder 240. For example, at least one of a fluid flow rate, fluid temperature, heat transfer gas type, heat transfer gas pressure, clamping force, resistive heater element current or voltage, thermoelectric device current or polarity, etc. can be adjusted in order to affect a change in the temperature of substrate holder 240.

Referring again to FIGS. 2 and 3, chemical treatment system 220 can comprise an upper assembly 260 having a gas distribution system.

Figure 8A:
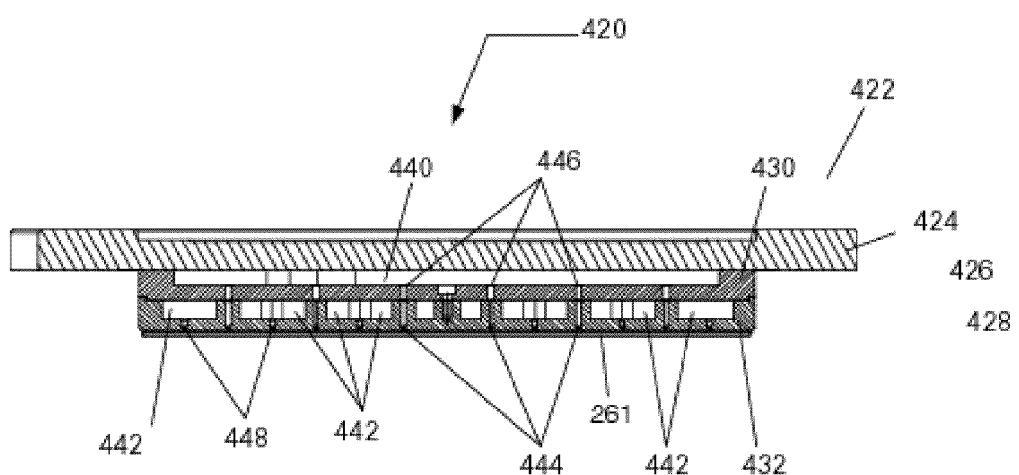
FIG. 8A illustrates a schematic cross-sectional view of a gas distribution system according to another embodiment of the present invention.
Figure 8B:
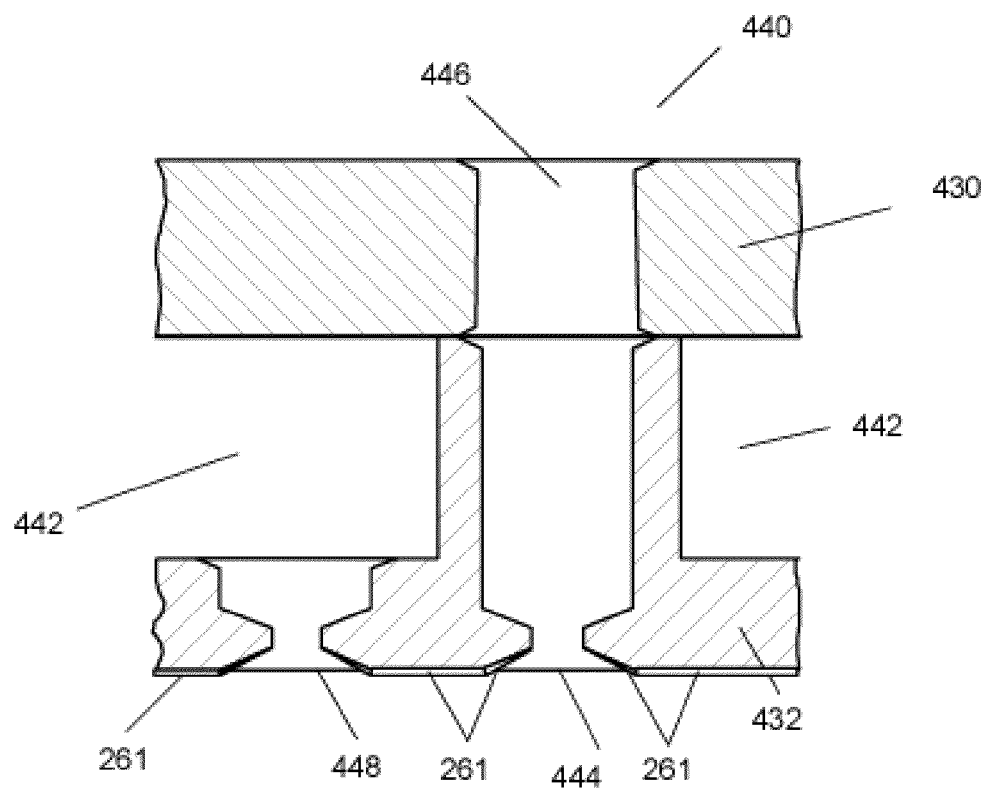
FIG. 8B presents an expanded view of the gas distribution system shown in FIG. 8A according to an embodiment of the present invention.

In the embodiment shown in FIGS. 8A and 8B (expanded view of FIG. 8A), a gas distribution system 420 for distributing a process gas, which can comprise at least two gases, comprises a gas distribution assembly 424, a first gas distribution plate 430 coupled to the gas distribution assembly 424 and configured to couple a first gas to the process space of chemical treatment chamber 221, and a second gas distribution plate 432 coupled to the first gas distribution plate 430 and configured to couple a second gas to the process space of chemical treatment chamber 221. The first gas distribution plate 430, when coupled to the gas distribution assembly 424, forms a first gas distribution plenum 440. Additionally, the second gas distribution plate 432, when coupled to the first gas distribution plate 430 forms a second gas distribution plenum 442. Although not shown, gas distribution plenums 440, 442 can comprise one or more gas distribution baffle plates. The second gas distribution plate 432 can further comprise a first array of one or more orifices 444 coupled to and coincident with an array of one or more passages 446 formed within the first gas distribution plate 430, and a second array of one or more orifices 448. The first array of one or more orifices 444, in conjunction with the array of one or more passages 446, are configured to distribute the first gas from the first gas distribution plenum 440 to the process space of chemical treatment chamber 221. The second array of one or more orifices 448 is configured to distribute the second gas from the second gas distribution plenum 442 to the process space of chemical treatment chamber 221. The process gas can, for example, comprise $NH_3$, HF, $H_2$, $O_2$, CO, $CO_2$, Ar, He, etc. Each orifice 444, 448 has a diameter and a length, wherein the diameter can range from about 0.1 mm to about 10 cm, and the length can range from about 0.5 mm to about 5 cm. In addition, each orifice can have a protective barrier 261 on one or more surfaces exposed to the processing space. Protective barrier 261 can be made of a material selected from the same range of materials and can have the same thickness as was described for protective barrier 241. Alternatively protective barrier 261 is not required. As a result of this arrangement, the first gas and the second gas are independently introduced to the process space without any interaction except in the process space.

Referring again to FIGS. 2 and 3, chemical treatment system 220 can further comprise a temperature controlled chemical treatment chamber 221 that is maintained at an elevated temperature. For example, a wall temperature control element 266 can be coupled to a wall temperature control unit 268, and the wall temperature control element 266 can be configured to couple to the chemical treatment chamber 221. The temperature control element can, for example, comprise a resistive heater element and/or a cooling element. The temperature of the chemical treatment chamber 221 can be monitored using a temperature-sensing device such as a thermocouple (e.g. a K-type thermocouple, Pt sensor, etc.). Furthermore, a controller can utilize the temperature measurement as feedback to the wall temperature control unit 268 in order to control the temperature of the chemical treatment chamber 221.

Referring again to FIG. 3, chemical treatment system 220 can further comprise an upper assembly 260 that can include a temperature controlled gas distribution system that can be use to maintain the upper assembly and/or the process gas at a selected temperature. For example, a temperature control element 267 can be coupled to a gas distribution system temperature control unit 269, and the temperature control element 267 can be configured to be coupled to the gas distribution system 260. The temperature control element can, for example, comprise a resistive heater element and/or cooling element. The temperature of the upper assembly and/or process gas can be monitored using a temperature-sensing device such as a thermocouple (e.g. a K-type thermocouple, Pt sensor, etc.). Furthermore, a controller can utilize the temperature measurement as feedback to the gas distribution system temperature control unit 269 in order to control the temperature of the upper assembly and/or process gas.

Referring still to FIGS. 2 and 3, vacuum pumping system 250 can comprise a vacuum pump 252 and a gate valve 254 for throttling the chamber pressure. Vacuum pump 252 can, for example, include a turbo-molecular vacuum pump (TMP) capable of a pumping speed up to 5000 liters per second (and greater). For example, the TMP can be a Seiko STP-A803 vacuum pump, or an Ebara ET1301W vacuum pump. TMPs are useful for low pressure processing, typically less than about 50 mTorr. For high pressure (i.e., greater than about 100 mTorr) or low throughput processing (i.e., no gas flow), a mechanical booster pump and dry roughing pump can be used.

Referring again to FIG. 3, chemical treatment system 220 can further comprise a controller 235 having a microprocessor, memory, and a digital I/O port capable of generating control voltages sufficient to communicate and activate inputs to chemical treatment system 220 as well as monitor outputs from chemical treatment system 220 such as temperature and pressure sensing devices. Moreover, controller 235 can be coupled to and can exchange information with substrate holder assembly 244, gas distribution system 260, vacuum pumping system 250, gate valve assembly 296, wall temperature control unit 268, and gas distribution system temperature control unit 269. For example, a program stored in the memory can be utilized to activate the inputs to the aforementioned components of chemical treatment system 220 according to a process recipe. One example of controller 235 is a DELL PRECISION WORKSTATION 610™, available from Dell Corporation, Austin, Tex.

Figure 4:
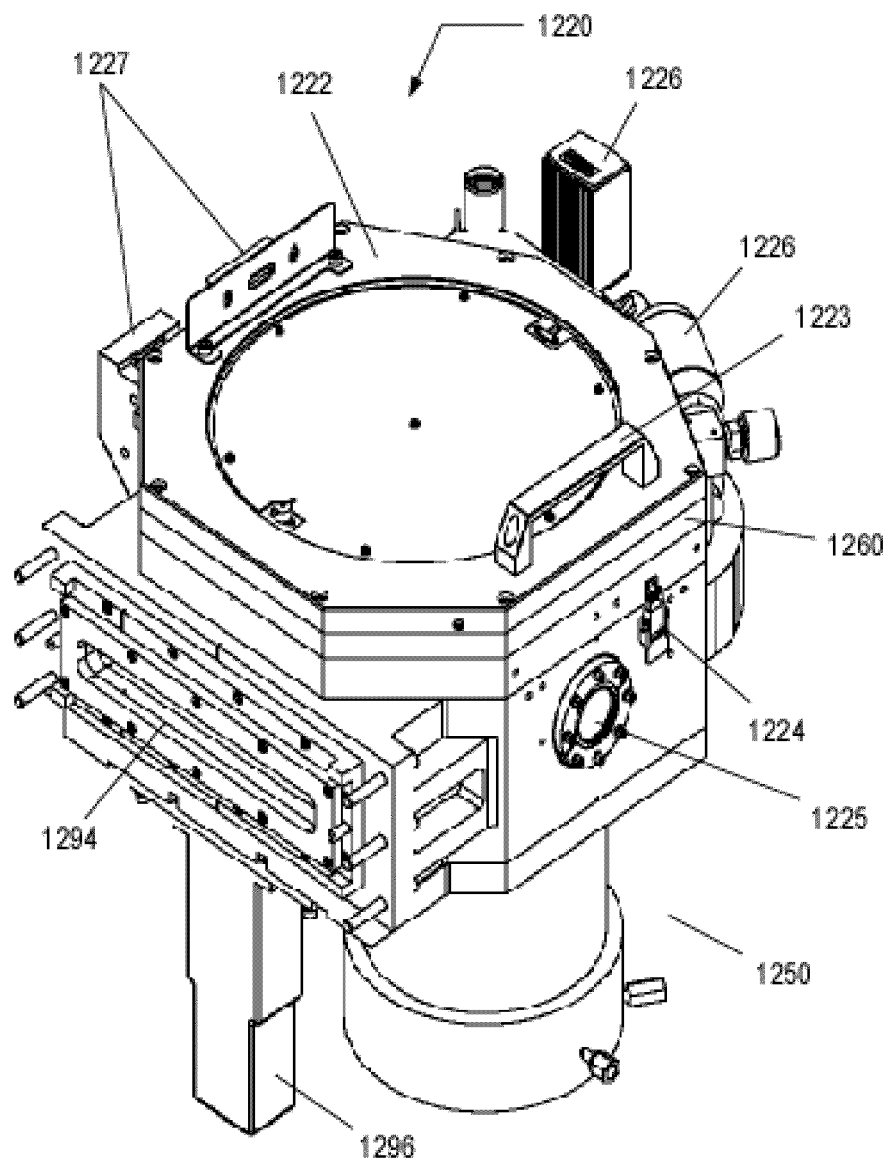
FIG. 4 shows a schematic perspective view of a chemical treatment system according to another embodiment of the present invention.

In one example, FIG. 4 presents a chemical treatment system 1220 further comprising a lid 1222 with a handle 1223, at least one clasp 1224, and at least one hinge 1227, an optical viewport 1225, and at least one pressure sensing device 1226.

Optical viewport 1225 can comprise an optical window (not shown), and an optical window flange (not shown) can couple the optical window to the chamber wall. Optical monitoring system 202 can permit monitoring of optical emission from the processing space through optical viewport 1225. For example, a photodiode, a photomultiplier tube, a CCD, CID, or other solid state detector can be used. However, other optical devices capable of analyzing optical emissions, can be used as well. The monitoring system 202 can provide information to controller in order to adjust chamber conditions before, during, or after processing. In an alternate embodiment, optical monitoring system 202 can also include a light source, such a laser.

Monitoring system component status using an optical monitoring system can include determining if the intensity level of an optical signal reflected from a system component exceeds a threshold value, arriving at a determination of whether the system component needs to be cleaned and/or replaced, and based on the determination, either continuing with the process or stopping the process.

For example, the status of a system component can be determined during a plasma process, by monitoring optical emission from a material deposited on a surface of a system component. One possible method for determining the status of contamination material on a system component is to use optical emission spectroscopy (OES) to monitor a wavelength range where one or more of the material's reflectivity characteristics change. During processing, a material can coat a system component and the thickness of the material can be determined by monitoring the optical characteristics of the deposited material, and these optical characteristics can be monitored during the plasma process. When an optical characteristic crosses a specified threshold value, a determination can be made whether or not to clean the system component, and based on the determination, the process can be continued or stopped.

As described in FIGS. 2 and 5, the thermal treatment system 210 can further comprise a temperature controlled substrate holder 270. The substrate holder 270 comprises a pedestal 272 thermally insulated from the thermal treatment chamber 211 using a thermal barrier 274. For example, the substrate holder 270 can be fabricated from aluminum, stainless steel, or nickel, and the thermal barrier 274 can be fabricated from a thermal insulator such as PTFE, TFE, alumina, or quartz. The substrate holder 270 can further comprise a temperature control element 276 embedded therein and a substrate holder temperature control unit 278 coupled thereto. The temperature control element 276 can, for example, comprise a resistive heater element and/or cooling element.

The temperature of the substrate holder 270 can be monitored using a temperature-sensing device such as a thermocouple (e.g. a K-type thermocouple) or an optical fiber thermometer. Furthermore, a controller 275 can utilize the temperature measurement as feedback to the substrate holder temperature control unit 278 in order to control the temperature of the substrate holder 270.

Referring again to FIG. 5, thermal treatment system 210 can further comprise a temperature controlled thermal treatment chamber 211 that is maintained at a selected temperature. For example, a thermal wall control element 283 can be coupled to a thermal wall temperature control unit 281, and the thermal wall control element 283 can be coupled to the thermal treatment chamber 211. The control element can, for example, comprise a resistive heater element such as a tungsten, nickel-chromium alloy, aluminum-iron alloy, or aluminum nitride filament. Alternatively, or in addition, cooling elements may be employed in thermal treatment chamber 211. The temperature of the thermal treatment chamber 211 can be monitored using a temperature-sensing device such as a thermocouple (e.g. a K-type thermocouple, Pt sensor, etc.). Furthermore, controller 275 can utilize the temperature measurement as feedback to the thermal wall temperature control unit 281 in order to control the temperature of the thermal treatment chamber 211.

Referring again to FIG. 5, thermal treatment system 210 can further comprise a temperature controlled upper assembly 284 that can be maintained at a selected temperature. For example, an upper assembly temperature control element 285 can be coupled to an upper assembly temperature control unit 286, and the upper assembly temperature control element 285 can be coupled to the upper assembly 284. The temperature control element can, for example, comprise a resistive heater element such as a tungsten, nickel-chromium alloy, aluminum-iron alloy, or aluminum nitride filament. The temperature of the upper assembly 284 can be monitored using a temperature-sensing device such as a thermocouple (e.g. a K-type thermocouple, Pt sensor, etc.). Furthermore, controller 275 can utilize the temperature measurement as feedback to the upper assembly temperature control unit 286 in order to control the temperature of the upper assembly 284. Upper assembly 284 may additionally or alternatively include a cooling element.

Referring again to FIGS. 2 and 5, thermal treatment system 210 can further comprise a substrate lifter assembly 290 and drive system 530. Substrate lifter assembly 290 can be configured to lower a substrate 242' to an upper surface of the substrate holder 270, as well as raise a substrate 242" from an upper surface of the substrate holder 270 to a holding plane, or a transfer plane therebetween. At the transfer plane, substrate 242" can be exchanged with a transfer system utilized to transfer substrates into and out of the chemical and thermal treatment chambers 221, 211. At the holding plane, substrate 242" can be cooled while another substrate is exchanged between the transfer system and the chemical and thermal treatment chambers 221, 211.

Figure 9:
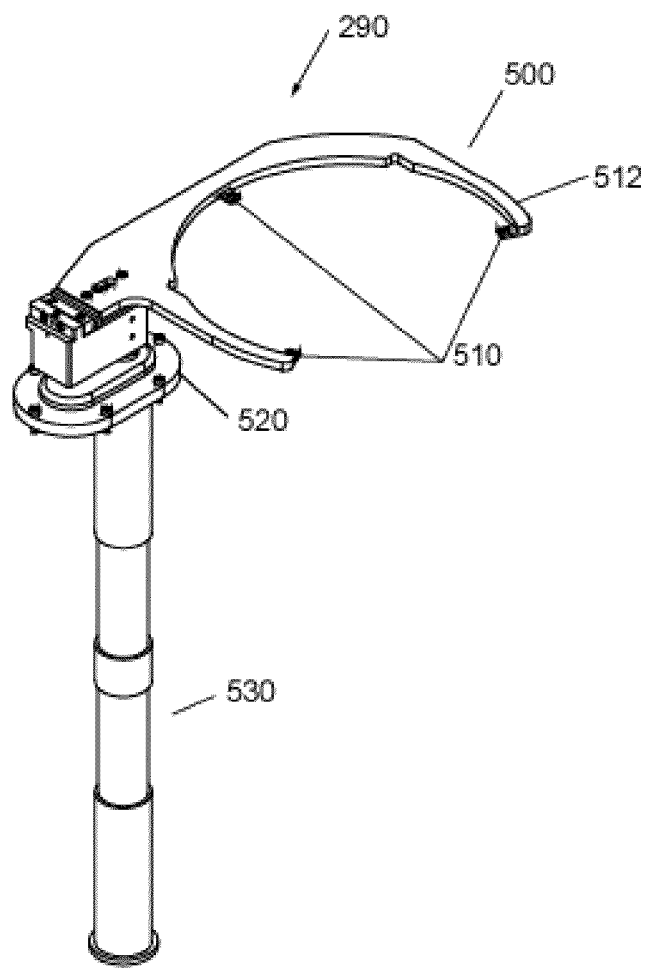
FIG. 9 shows a substrate lifter assembly according to an embodiment of the present invention.

As shown in FIG. 9, the substrate lifter assembly 290 can comprise a blade 500 having three or more tabs 510, a flange 520 for coupling the substrate lifter assembly 290 to the thermal treatment chamber 211, and a drive system 530 for permitting vertical translation of the blade 500 within the thermal treatment chamber 211. The tabs 510 are configured to grasp substrate 242" in a raised position, and to recess within receiving cavities 540 (FIG. 5) formed within the substrate holder 270 when in a lowered position. The drive system 530 can, for example, be a pneumatic drive system designed to meet various specifications including cylinder stroke length, cylinder stroke speed, position accuracy, non-rotation accuracy, etc., the design of which is known to those skilled in the art of pneumatic drive system design.

Furthermore, a protective barrier 512 can be formed on one or more surfaces of the blade 500. Protective barrier 512 can be made of a material selected from the same range of materials and can have the same thickness as was described for protective barrier 241. Alternatively protective barrier 512 is not required.

Referring still to FIGS. 2 and 5, thermal treatment system 210 can further comprise a vacuum pumping system 280. Vacuum pumping system 280 can, for example, comprise a vacuum pump, and a throttle valve such as a gate valve or butterfly valve. The vacuum pump can, for example, include a turbo-molecular vacuum pump (TMP) capable of a pumping speed up to 5000 liters per second (and greater). TMPs are useful for low pressure processing, typically less than about 50 mTorr. For high pressure processing (i.e., greater than about 100 mTorr), a mechanical booster pump and dry roughing pump can be used.

Referring again to FIG. 5, thermal treatment system 210 can further comprise a controller 275 having a microprocessor, memory, and a digital I/O port capable of generating control voltages sufficient to communicate and activate inputs to thermal treatment system 210 as well as monitor outputs from thermal treatment system 210. Moreover, controller 275 can be coupled to and can exchange information with substrate holder temperature control unit 278, upper assembly temperature control unit 286, upper assembly 284, thermal wall temperature control unit 281, vacuum pumping system 280, and substrate lifter assembly 290. For example, a program stored in the memory can be utilized to activate the inputs to the aforementioned components of thermal treatment system 210 according to a process recipe. One example of controller 275 is a DELL PRECISION WORKSTATION 610™, available from Dell Corporation, Austin, Tex.

In an alternate embodiment, controllers 235 and 275 can be the same controller.

Figure 6:
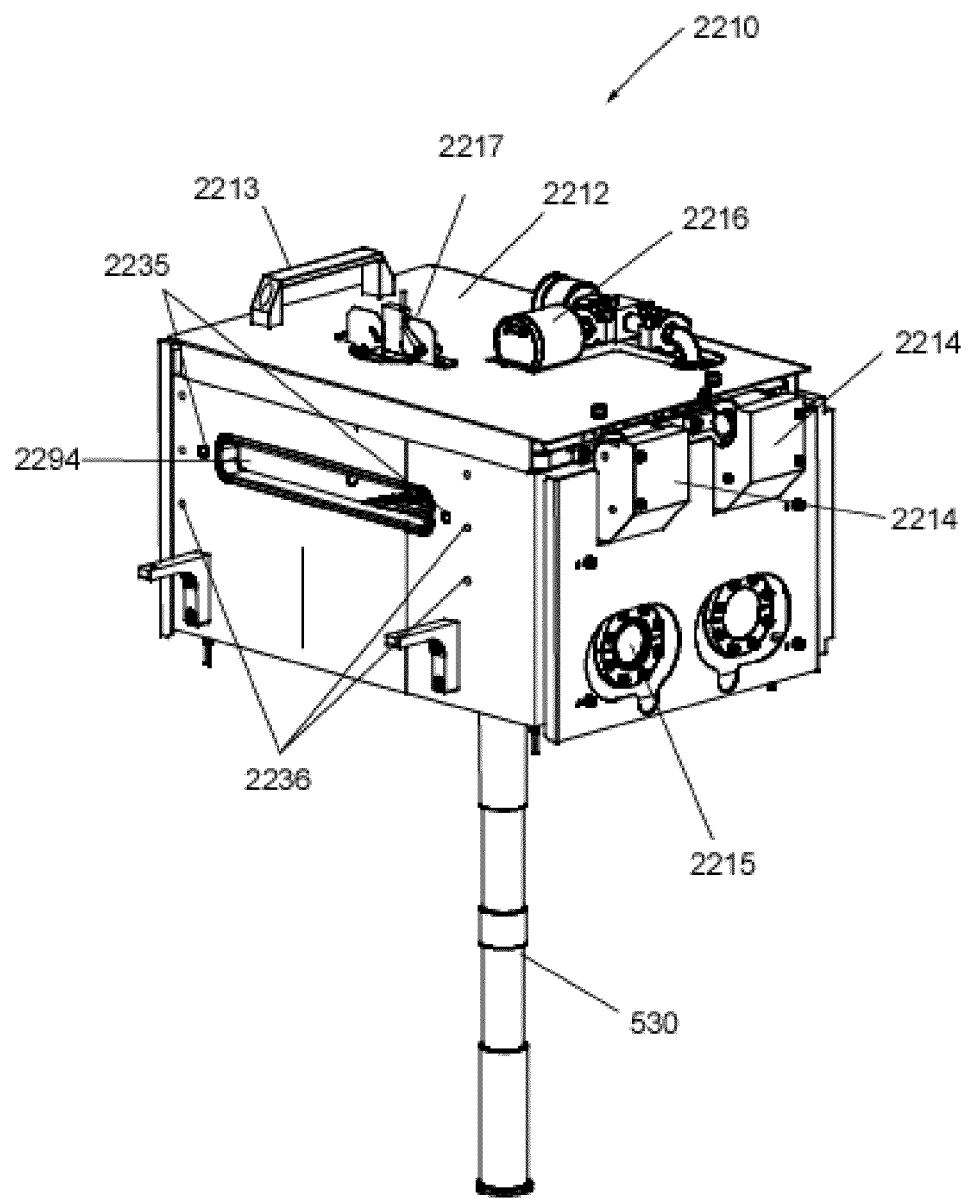
FIG. 6 shows a schematic perspective view of a thermal treatment system according to another embodiment of the present invention.

As one example, FIG. 6 presents a thermal treatment system 2210 further comprising a lid 2212 with a handle 2213 and at least one hinge 2214, an optical viewport 2215, at least one pressure-sensing device 2216, at least one alignment device 2235, and at least one fastening device 2236. Additionally, the thermal treatment system 2210 can further comprise a substrate detection system 2217 in order to identify whether a substrate is located in the holding plane. The substrate detection system can, for example, comprise a Keyence digital laser sensor.

In an example, the processing system 200, as depicted in FIG. 2, can be a chemical oxide removal (COR) system for trimming an oxide hard mask. The processing system 200 can comprise chemical treatment system 220 for chemically treating exposed surface layers, such as oxide surface layers, on a substrate, whereby adsorption of the process chemistry on the exposed surfaces affects chemical alteration of the surface layers. Additionally, the processing system 200 can comprise thermal treatment system 210 for thermally treating the substrate, whereby the substrate temperature is elevated in order to desorb (or evaporate) the chemically altered exposed surface layers on the substrate.

In the chemical treatment system 220, the process space 262 (see FIG. 2) is evacuated, and a process gas comprising HF and $NH_3$ is introduced. The processing pressure can range from about 1 to about 100 mTorr, or alternatively, from about 2 to about 25 mTorr. The process gas flow rates can range from about 1 to about 200 sccm for each specie, or alternatively, from about 10 to about 100 sccm. Although the vacuum pumping system 250 is shown in FIGS. 2 and 3 to access the chemical treatment chamber 221 from the side, a uniform (three-dimensional) pressure field can be achieved. Table I illustrates the dependence of the pressure uniformity at the substrate surface as a function of processing pressure and the spacing between the gas distribution system 260 and the upper surface of substrate 242.

TABLE I

| (%) | h (spacing) | | | | |
|---|---|---|---|---|---|
| Pressure | 50 mm | 62 | 75 | 100 | 200 |
| 20 mTorr | 0.6 | NA | NA | NA | NA |
| 9 | NA | NA | 0.75 | 0.42 | NA |
| 7 | 3.1 | 1.6 | 1.2 | NA | NA |
| 4 | 5.9 | 2.8 | NA | NA | NA |
| 3 | NA | 3.5 | 3.1 | 1.7 | 0.33 |

Additionally, the chemical treatment chamber 221 can be heated to a temperature ranging from about 30° to about 100° C. For example, the temperature can be about 40° C. Additionally, the gas distribution system can be heated to a temperature ranging from about 40° to about 100° C. For example, the temperature can be about 50° C. The substrate can be maintained at a temperature ranging from about 10° to about 50° C. For example, the substrate temperature can be about 20° C.

In the thermal treatment system 210, the thermal treatment chamber 211 can be heated to a temperature ranging from about 50° to about 100° C. For example, the temperature can be about 80° C. Additionally, the upper assembly can be heated to a temperature ranging from about 50° to about 100° C. For example, the temperature can be about 80° C. The substrate can be heated to a temperature in excess of about 100° C. For example, the temperature can range from about 100° to about 200° C. Alternatively, the temperature can be about 135° C.

The chemical treatment and thermal treatment described herein can produce an etch amount of an exposed oxide surface layer in excess of about 10 nm per 60 seconds of chemical treatment for thermal oxide, an etch amount of the exposed oxide surface layer in excess of about 25 nm per 180 seconds of chemical treatment for thermal oxide, and an etch amount of the exposed oxide surface layer in excess of about 10 nm per 180 seconds of chemical treatment of ozone TEOS. The treatments can also produce an etch variation across the substrate of less than about 2.5%.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A reduced maintenance processing system for treating a substrate comprising:
   a chemical treatment system for chemically altering one or more exposed surface layers on the substrate, wherein a protective barrier is formed on an interior surface of the chemical treatment system, the protective barrier provided with a minimum thickness ranging from about 100 microns to about 200 microns, and comprising an anodized metal impregnated with polytetrafluoroethylene (PTFE) and/or tetrafluoroethylene (TFE), the chemical treatment system comprising:
      a temperature controlled chemical treatment chamber,
      a wall temperature control unit coupled to a wall heating element coupled to the temperature controlled chemical treatment chamber and configured to control a temperature of the temperature controlled chemical treatment chamber,
      a temperature controlled substrate holder mounted within the temperature controlled chemical treatment chamber, wherein the temperature controlled substrate holder is configured to support the substrate having the one or more exposed surface layers,
      a temperature control component coupled to the temperature controlled substrate holder and configured to control a temperature of the temperature controlled substrate holder,
      a vacuum pumping system coupled to the temperature controlled chemical treatment chamber,
      a gas distribution system coupled to the temperature controlled chemical treatment chamber and configured to introduce one or more process gases to the temperature controlled chemical treatment chamber in order to chemically alter the exposed surface layers on the substrate, and
      a gas distribution system temperature control unit coupled to a gas distribution heating element coupled to the temperature controlled portion and configured to control a temperature of the gas distribution system;
   a thermal treatment system for thermally treating the chemically altered surface layers on the substrate to remove the chemically altered surface layers, the thermal treatment system comprising a temperature controlled thermal treatment chamber; and
   a thermal insulation assembly coupled to and disposed between the thermal treatment system and the chemical treatment system.

2. The processing system as claimed in claim 1, wherein the temperature of the temperature controlled chemical treatment chamber ranges from about 30° C. to about 100° C., and the temperature of the gas distribution system ranges from about 40° C. to about 100° C.

3. The processing system as claimed in claim 1, wherein the temperature of the substrate ranges from about 10° C. to about 50° C.

4. The processing system as claimed in claim 1, wherein the metal comprises at least one of aluminum and an aluminum alloy.

5. The processing system as claimed in claim 1, wherein the protective barrier is formed on at least a portion of the temperature controlled substrate holder.

6. The processing system as claimed in claim 1, wherein the gas distribution system further comprises a gas distribution plate comprising a plurality of gas injection orifices and having the protective barrier formed on at least a portion of an exposed surface of the gas distribution plate and at least a portion of an exposed surface of each orifice, wherein a temperature of the gas distribution plate is controlled by the gas distribution system temperature control unit coupled to the gas distribution system.

7. The processing system as claimed in claim 6, wherein the process gas comprises a first gas and a second gas.

8. The processing system as claimed in claim 7, wherein the first gas comprises at least one of $NH_3$, HF, $H_2$, $O_2$, CO, $CO_2$, Ar, He, and $N_2$.

9. The processing system as claimed in claim 7, wherein the second gas comprises at least one of $NH_3$, HF, $H_2$, $O_2$, CO, $CO_2$, Ar, He, and $N_2$.

10. The processing system as claimed in claim 7, wherein the plurality of gas injection orifices comprises a first array of orifices for coupling the first gas to the process space and a second array of orifices for coupling the second gas to the process space.

11. The processing system as claimed in claim 1, wherein the protective barrier on the interior surface of the chemical treatment system comprises a hard anodized metal impregnated with tetrafluoroethylene (TFE) and/or polytetrafluoroethylene (PTFE).

12. The processing system as claimed in claim 11, wherein the metal comprises at least one of aluminum and an aluminum alloy.

13. The processing system as claimed in claim 1, wherein the temperature controlled thermal treatment chamber has a protective barrier formed on at least a portion of an interior surface, and wherein the protective barrier on the interior surface of temperature controlled thermal treatment chamber comprises an anodized metal impregnated with polytetrafluoroethylene (PTFE) and/or tetrafluoroethylene (TFE).

14. The processing system as claimed in claim 13, wherein the protective barrier on the interior surface of the temperature controlled thermal treatment chamber comprises a hard anodized metal impregnated with tetrafluoroethylene (TFE) and or polytetrafluoroethylene (PTFE).

15. The processing system as claimed in claim 13, wherein the metal comprises at least one of aluminum and an aluminum alloy.

16. The processing system as claimed in claim 1, wherein the thermal treatment system further comprises a temperature controlled substrate holder mounted within the thermal treatment chamber and having a protective barrier formed on at least a portion of an exposed surface, the protective barrier on the exposed surface of the temperature controlled substrate holder mounted within the temperature controlled thermal treatment chamber comprises an anodized metal impregnated with polytetrafluoroethylene (PTFE) and/or tetrafluoroethylene (TFE).

17. The processing system as claimed in claim 1, wherein the thermal insulation assembly comprises a gate valve assembly, wherein a protective barrier is formed on at least a portion of an exposed surface of the gate valve assembly.

18. The processing system as claimed in claim 17, wherein the protective barrier on the exposed surface of the gate valve assembly comprises an anodized metal impregnated with polytetrafluoroethylene (PTFE) and/or tetrafluoroethylene (TFE).

19. The processing system as claimed in claim 1, wherein the thermal treatment system further comprises a substrate lifter assembly coupled to the thermal treatment chamber for vertically translating the substrate between a transfer plane and the substrate holder.

20. The processing system as claimed in claim 19, wherein the substrate lifter assembly comprises a blade having three or more tabs for receiving the substrate and having a protective barrier formed on at least a portion of an exposed surface, and a drive system for vertically translating the substrate between the substrate holder and a transfer plane.

21. The processing system as claimed in claim 20, wherein the protective barrier on the at least one exposed surface of the blade comprises an anodized metal impregnated with polytetrafluoroethylene (PTFE) and/or tetrafluoroethylene (TFE).

\* \* \* \* \*